US012807901B2

(12) United States Patent
Cho et al.

(10) Patent No.: US 12,807,901 B2
(45) Date of Patent: Nov. 24, 2026

(54) STRIPPER COMPOSITION

(71) Applicant: Samsung Electronics Co., Ltd., Suwon-si (KR)

(72) Inventors: Minhyung Cho, Suwon-si (KR); Minju Im, Iksan-si (KR); Hyojoong Yoon, Iksan-si (KR); Mihyun Park, Suwon-si (KR); Jinhye Bae, Suwon-si (KR); Taekyung Lee, Iksan-si (KR); Sangwon Bae, Suwon-si (KR)

(73) Assignees: Samsung Electronics Co., Ltd., Gyeonggi-do (KR); DONGWOO FINE-CHEM Co., Ltd., Jeollabuk-do (KR)

(*) Notice: Subject to any disclaimer, the term of this patent is extended or adjusted under 35 U.S.C. 154(b) by 213 days.

(21) Appl. No.: 18/413,777

(22) Filed: Jan. 16, 2024

(65) Prior Publication Data

US 2024/0309298 A1 Sep. 19, 2024

(30) Foreign Application Priority Data

Mar. 17, 2023 (KR) ........................ 10-2023-0035395

(51) Int. Cl.

| | |
|---|---|
| ***C11D 3/20*** | (2006.01) |
| ***C09K 13/00*** | (2006.01) |
| ***C09K 13/02*** | (2006.01) |
| ***C11D 3/30*** | (2006.01) |
| ***C11D 3/39*** | (2006.01) |
| ***C11D 7/06*** | (2006.01) |
| ***C11D 7/26*** | (2006.01) |
| ***C11D 7/50*** | (2006.01) |
| ***G03F 7/42*** | (2006.01) |
| ***H10P 70/00*** | (2026.01) |

(52) U.S. Cl.
CPC ............ *C11D 3/201* (2013.01); *C11D 3/2017* (2013.01); *C11D 3/2068* (2013.01); *C11D 3/30* (2013.01); *C11D 3/3927* (2013.01); *G03F 7/425* (2013.01); *H10P 70/273* (2026.01); *C11D 2111/22* (2024.01)

(58) Field of Classification Search
None
See application file for complete search history.

(56) References Cited

U.S. PATENT DOCUMENTS

| | | | | |
|---|---|---|---|---|
| 6,828,289 | B2 * | 12/2004 | Peters | C11D 7/5022 510/176 |
| 8,110,535 | B2 | 2/2012 | Egbe | |
| 9,223,221 | B2 | 12/2015 | Braun et al. | |
| 10,351,809 | B2 | 7/2019 | Thomas et al. | |
| 10,833,251 | B2 | 11/2020 | Kim et al. | |
| 2006/0016785 | A1 * | 1/2006 | Egbe | G03F 7/425 252/79.1 |
| 2009/0131295 | A1 * | 5/2009 | Cui | H10P 70/27 510/176 |
| 2011/0245128 | A1 * | 10/2011 | Kang | G03F 7/425 510/176 |
| 2012/0058644 | A1 * | 3/2012 | Klipp | G03F 7/425 510/176 |
| 2014/0100151 | A1 * | 4/2014 | Egbe | C11D 7/06 510/176 |
| 2017/0037344 | A1 * | 2/2017 | Chang | G03F 7/425 |

FOREIGN PATENT DOCUMENTS

| | | | |
|---|---|---|---|
| CN | 101614970 | B | 12/2012 |
| CN | 103676504 | B | 8/2016 |
| CN | 112080279 | A | * 12/2020 |
| JP | 2006-063201 | A | 3/2006 |
| JP | 2008-007660 | A | 1/2008 |
| JP | 2009116243 | A | * 5/2009 |
| KR | 20080111268 | A | * 12/2008 |
| KR | 10-2010-0051533 | A | 5/2010 |
| KR | 10-1230319 | B1 | 2/2013 |
| KR | 10-1571753 | B1 | 11/2015 |
| WO | WO-2010/127941 | A1 | 11/2010 |

* cited by examiner

*Primary Examiner* — Lorna M Douyon
(74) *Attorney, Agent, or Firm* — Harness, Dickey & Pierce, P.L.C.

(57) ABSTRACT

A stripper composition may include a polar organic solvent, a pH-adjusting agent, and an ammonium salt or a diamine compound, and deionized water (DIW). In the diamine compound, a main chain between amines may have 4 or fewer carbon atoms.

8 Claims, 1 Drawing Sheet

STRIPPER COMPOSITION

CROSS-REFERENCE TO RELATED APPLICATION

This application is based on and claims priority under 35 U.S.C. § 119 to Korean Patent Application No. 10-2023-0035395, filed on Mar. 17, 2023 in the Korean Intellectual Property Office, the disclosure of which is incorporated by reference herein in its entirety.

BACKGROUND

Inventive concepts relate to a stripper composition, and more particularly, to a stripper composition having low electrical conductivity.

In a process of manufacturing a semiconductor element, a strip process may be performed after a dry etch process to remove $AlO_x$, which may be used as an etch stop layer, residue, and the like.

In the strip process, there exists a possibility that a lower metal may be damaged during the removing process of the residue and the metal oxide film, which are generated after the dry etching. In addition, there are risks that additional metal etching occurs due to an electrochemical reaction caused by accumulated charges. Therefore, research to limit and/or minimize the risks is being conducted.

SUMMARY

Inventive concepts provide a stripper composition capable of stably performing a strip process by lowering electrical conductivity of a stripper composition itself.

Also, aspects of inventive concepts are not limited to the aforementioned aspects, but other aspects not described herein will be clearly understood by those skilled in the art from the following description.

According to aspects of inventive concepts, there are provided stripper compositions as follows.

According to an embodiment of inventive concepts, a stripper composition may include (or consist of) a polar organic solvent, a pH-adjusting agent, an ammonium salt, and deionized water (DIW).

According to an embodiment of inventive concepts, a stripper composition may include (or consist of) a polar organic solvent, a pH-adjusting agent, a diamine compound in which a main chain between amines has 4 or fewer carbon atoms, and DIW.

BRIEF DESCRIPTION OF THE DRAWINGS

Embodiments will be more clearly understood from the following detailed description taken in conjunction with the accompanying drawings in which.

DETAILED DESCRIPTION

Figure 1:
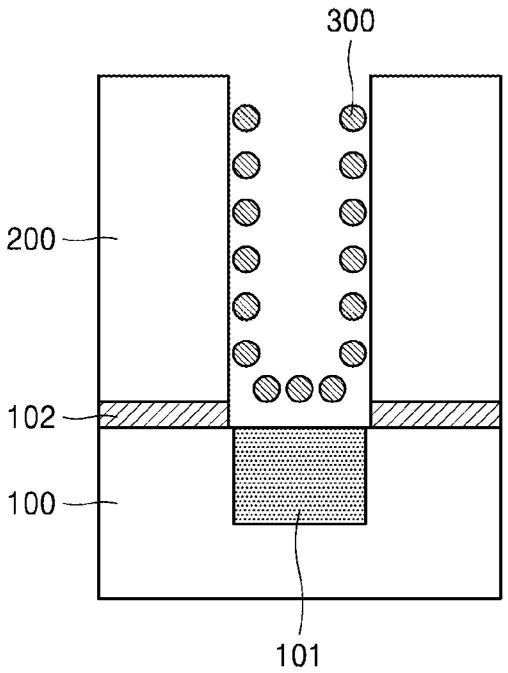
FIG. 1 is a cross-sectional view schematically illustrating that, after a dry etching, a generated residue may remain on films on a substrate.

The present embodiments may be variously modified and may be embodied in different forms, and specific embodiments will be explained in detail with reference to the drawings in the detailed description. It should be understood, however, that it is not intended to limit to the particular embodiments, but rather, is intended to include all modifications, equivalents, and alternatives falling within the disclosed spirit and technical scope of inventive concepts. In describing embodiments, detailed descriptions of related art may be omitted when it is determined that such detailed descriptions would obscure the gist of inventive concepts.

Throughout this specification, when a certain part "includes" a certain component, it means that other components may be further included rather than excluding other components unless otherwise stated.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Whenever a range of values is enumerated, the range includes all values that fall within the range, as explicitly written, and additionally includes the boundaries of the range, such as increments of 0.1%. Accordingly, the range "X to Y" includes all values between X and Y, and also includes X and Y together.

Provided is a stripper composition for removing residue generated after a dry etching process, wherein the stripper composition includes a polar organic solvent, a pH-adjusting agent, and an ammonium salt, and a material constituting the remainder may include or be deionized water (DIW).

In addition, provided is a stripper composition for removing residue generated after a dry etching process, wherein the stripper composition includes a polar organic solvent, a pH-adjusting agent, a diamine compound in which a main chain between amines has 4 or fewer carbon atoms, and a material constituting the remainder may be or include DIW.

Hereinafter, each of compounds included in the stripper composition will be described in detail.

The polar organic solvent included in the stripper composition according to inventive concepts may be a protic polar solvent having a dielectric constant of 30 or less. The organic solvent, unlike a water-based solvent, may control the dissolution rate of an aluminum oxide film and may thus achieve a reduced etching rate. When the dielectric constant is at least 30, the conductivity of the stripper composition may increase. In addition, when the conductivity of the stripper composition is high, the possibility of current flow may increase due to charges accumulated during the process.

Examples of the organic solvent may include alcohols, glycol ethers, etc. Particularly, when glycol ethers are used, resistance of a tungsten film to the glycol ethers may be relatively better than those to other organic solvents. Specific examples of the alcohols may include a linear alcohol such as ethanol, propanol, butanol, pentanol, hexanol, heptanol, octanol, nonanol, and decanol. Another specific example of the alcohols may include diols such as 1,5-pentanediol, and 1,6-hexanediol. Another specific example of the alcohols may include a branched alcohol such as DL-2-methyl-1-butanol, and 4-methyl-2-pentanol. Specific examples of glycol ethers may include diethyleneglycol monomethyl ether, diethyleneglycol monoethyl ether, triethyleneglycol monomethyl ether, triethyleneglycol monobutyl ether, propyleneglycol monomethyl ether, propyleneglycol monoethyl ether, propyleneglycol propyl ether, etc. However, inventive concepts are not limited thereto. The materials above may be used alone or in combination of two or more.

The content of the organic solvent is not particularly limited, and, for example, an amount of about 60 wt % to about 99.0 wt % with respect to the total weight of the stripper composition may be included. In some embodiments, an amount of about 70 wt % to about 95.0 wt % with respect to the total weight of the stripper composition may be included. When the amount of the organic solvent included in the stripper composition falls within the above-mentioned range, an appropriate etching rate may be exhibited.

The pH-adjusting agent included in the stripper composition according to inventive concepts increases alkalinity of the stripper composition and may thus increase a pH concentration in the composition. The pH-adjusting agent may be used to dissolve a metal oxide film into a metal hydroxide form.

Examples of the pH-adjusting agent may include alkylammonium hydroxide, an amidine compound, etc. Specific examples of alkylammonium hydroxide may include teteramethyl ammonium hydroxide, tetraethyl ammonium hydroxide, tetrapropyl ammonium hydroxide, etc. Specific examples of the amidine compound may include acetamidine, imidazoltan, 2-methylimidazole, 1,4,5,6-tetrahydropyrimidine, 2-methyl-1,4,5,6-tetrahydropyrimidine, 2-phenyl-1,4,5,6-tetrahydropyrimidine, aminopiperidine, 1,8 diazabicyclo[5.4.0]undec-7-ene-7-ene (DBU), 1,5-diazabicyclo[4.3.0]-5-nonene (DBN), 1,4-diaza bicyclo[2.2.2]octane (DABCO), 1,5,7-triazabicyclo[4.4.0]dec-5-ene (TBD), 7-methyl-1,5,7-triazabicyclo[4.4.0]dec-5-ene (MTBD), etc. However, inventive concepts are not limited thereto. The materials may be used alone or in combination of two or more, and the above-mentioned materials may etch into a metal hydroxide form by increasing the pH of the stripper composition.

The pH-adjusting agent may be included in an amount of about 0.01 wt % to about 0.1 wt % with respect to the total weight of the stripper composition. In some embodiments, an amount of about 0.02 wt % to about 0.08 wt % with respect to the total weight of the stripper composition may be included. When the pH-adjusting agent is included in an amount of less than 0.01 wt % with respect to the total weight of the stripper composition, the pH of the stripper composition may be in neutral or slightly alkalinity region. Therefore, the removal ability of the metal oxide film may become poorer. When the pH-adjusting agent is included in an amount of more than 0.1 wt % with respect to the total weight of the stripper composition, electrical conductivity increases and the etching rate is accelerated. Therefore, the lower metal film may be unprotected and damaged.

The ammonium salt included in the stripper composition according to inventive concepts forms a complex compound with a metal oxide and may thus improve the solubility of the metal oxide and serve as an anti-etching agent to protect a metal that is non-oxidized.

Examples of the ammonium salt may include ammonium hydroxide, ammonium citrate, ammonium acetate, ammonium malonate, ammonium adipate, ammonium lactate, ammonium iminodiacetate, ammonium chloride, ammonium bromide, ammonium sulfate, ammonium oxalate, ammonium lactate, ammonium tartrate, triammonium citrate, ammonium carbamate, ammonium carbonate, ammonium benzoate, tetraammonium ethylenediaminetetraacetate, diammonium ethylenediaminetetraacetate, ammonium succinate, ammonium formate, etc. However, inventive concepts are not limited thereto. The materials may be used alone or in combination of two or more.

The ammonium salt may be included in an amount of about 0.01 wt % to about 1 wt % with respect to the total weight of the stripper composition. In some embodiments, an amount of about 0.05 wt % to about 0.8 wt % with respect to the total weight of the stripper composition may be included. When the ammonium salt is included in an amount of less than 0.01 wt % with respect to the total weight of the stripper composition, the etching rate of the metal oxide film may decrease. When the ammonium salt is included in an amount of more than about 1.0 wt % with respect to the weight of the stripper composition, a phenomenon of an increase in electric conductivity occurs, and thus, damage to a silicon oxide film or a metal to be protected may be caused.

A diamine compound in which a main chain between amines has 4 or fewer carbon atoms (hereinafter, as used herein, referred to as a 'diamine compound'), which is contained in the stripper composition according to inventive concepts, may improve the solubility of the metal oxide by forming a complex compound with the metal oxide and may serve as an anti-etching agent that protects a non-oxidized metal. As used herein, the term 'having 4 or fewer carbon atoms' is calculated with respect to the number of carbon atoms of a main chain between amines and is determined with respect to the number of carbon atoms of the main chain only even if a side chain is included.

As the diamine compound, 1,2-diaminoethane, 1,2-diaminopropane, 1,3-diaminopropane, 1,3-diaminopentane, 1,4-diaminobutane, and the like may be included. However, inventive concepts are not limited thereto. The materials may be used alone or in combination of two or more.

The diamine compound may be included in an amount of about 0.01 wt % to about 3.0 wt % with respect to the total weight of the stripper composition. In some embodiments, an amount of about 0.1 wt % to about 2.5 wt % with respect to the total weight of the stripper composition may be included. When the diamine compound is included in the amount of less than 0.01 wt %, the etching rate of the metal oxide film may decrease and the etching rate of the metal film, which is a protective film, may be accelerated. When the diamine compound is included in the amount of more than about 3 wt %, an anti-etching performance may be improved, and thus, a decrease in the etching rate of the metal oxide film may also be caused.

The balance except for the polar organic solvent, the pH-adjusting agent, and the ammonium salt, each described above, or the balance except for the polar organic solvent, the pH-adjusting agent, and the diamine compound of the stripper composition may be deionized water included in the stripper composition according to inventive concepts.

The deionized water may be included in an amount of about 15 wt % to about 30 wt % with respect to the total weight of the stripper composition. When the deionized water is included in the amount of less than 15 wt % with respect to the total weight of the stripper composition, an etching rate of an aluminum oxide film may decrease. When the deionized water is included in an amount of more than 30 wt % with respect to the total weight of the stripper composition, the electrical conductivity may increase, and thus, damage to the lower metal film may be caused.

The stripper composition according to inventive concepts may have an electrical conductivity of higher than about 0.1 μs/cm and lower than about 99.9 μs/cm. When the electrical conductivity the stripper composition exceeds about 99.9 μs/cm, current may flow due to energy generated during the dry etching process, and as a result, the metal film, which is a lower protective film, may be damaged.

The stripper composition according to inventive concepts may include no oxidizer and no fluoride. When the oxidizer and the fluoride are included in the stripper composition, damage to the metal film and a silicon oxide film, which are lower protective films, may be caused.

The stripper composition according to inventive concepts may be universally used to remove not only an aluminum (Al) oxide film, and a tungsten (W) oxide film but also various types of metal oxide films such as a molybdenum (Mo) oxide film, a cobalt (Co) oxide film, and a ruthenium (Ru) oxide film.

Figure 2:
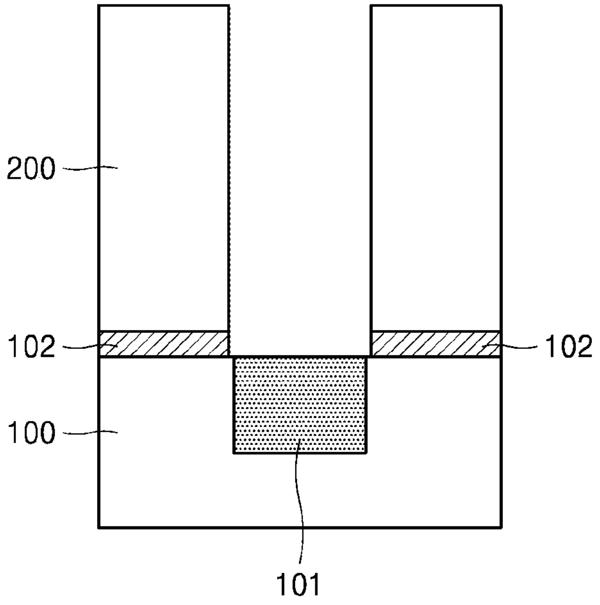
FIG. 2 is a cross-sectional view illustrating that the residue in FIG. 1 has been removed using a stripper composition according to inventive concepts.

FIG. 1 is a cross-sectional view schematically illustrating that generated residue remains on films on a substrate after the dry etching, and FIG. 2 illustrates that the residue in FIG. 1 has been removed using the stripper composition according to inventive concepts.

Referring to FIGS. 1 and 2, it is confirmed that when the stripper composition according to inventive concepts is used, residue 300 remaining between films 200 on a substrate 100 may be effectively removed without damaging a contact metal 101 disposed below the residue 300. Hereinafter, various examples that may become appropriate combinations for the stripper composition will be described with reference to Experiment Examples. As shown in FIGS. 1-2, an intermediate layer 102 (e.g., capping layer, barrier layer) may be formed between the films 200 and the substrate 100.

To evaluate the etching rate or the like of the stripper composition according to inventive concepts, compositions listed in Table 1 were added to a mixing tank with an agitator mounted, and then stripper compositions according to Examples 1 to 31 (Ex. 1 to Ex. 31) and Comparative Examples 1 to 5 (Comp. Ex. 1 to Comp. Ex. 5) were manufactured. In Table 1, "Ex." is an abbreviation for example, Comp." is an abbreviation for Comparative, "Fl." is an abbreviation for Fluoride, "Tot." is an abbreviation for total, and "Cond." is an abbreviation for conductivity.

TABLE 1

| | Solvent | | PH Adjusting Agent | | Ammonium Salt | | Diamine Compound | | Fl. | | Tot. | |
|---|---|---|---|---|---|---|---|---|---|---|---|---|
| Composition | Type | Wt % | Type | Wt % | Type | Wt % | Type | Wt % | E1 | DIW | Wt. | Cond. |
| Ex. 1 | A1 | 72.90 | B1 | 0.02 | C1 | 0.58 | | | | 26.50 | 100 | 40 |
| Ex. 2 | A2 | 72.90 | B1 | 0.02 | C1 | 0.58 | | | | 26.50 | 100 | 30 |
| Ex. 3 | A2 | 72.14 | B1 | 0.02 | C1 | 0.80 | | | | 27.04 | 100 | 45 |
| Ex. 4 | A2 | 72.90 | B1 | 0.06 | C1 | 0.58 | | | | 26.66 | 100 | 97 |
| Ex. 5 | A2 | 83.61 | B1 | 0.02 | C1 | 0.58 | | | | 15.79 | 100 | 20 |
| Ex. 6 | A2 | 74.75 | B1 | 0.04 | C2 | 0.05 | | | | 25.16 | 100 | 15 |
| Ex. 7 | A2 | 74.60 | B1 | 0.04 | C2 | 0.20 | | | | 25.16 | 100 | 60 |
| Ex. 8 | A3 | 72.90 | B1 | 0.02 | C1 | 0.58 | | | | 26.50 | 100 | 50 |
| Ex. 9 | A1 | 72.92 | B2 | 0.03 | C1 | 0.58 | | | | 26.47 | 100 | 42 |
| Ex. 10 | A2 | 72.92 | B2 | 0.03 | C1 | 0.58 | | | | 26.47 | 100 | 32 |
| Ex. 11 | A2 | 82.92 | B2 | 0.03 | C1 | 0.58 | | | | 16.47 | 100 | 21 |
| Ex. 12 | A2 | 74.66 | B2 | 0.05 | C2 | 0.20 | | | | 25.09 | 100 | 62 |
| Ex. 13 | A3 | 72.92 | B2 | 0.03 | C1 | 0.58 | | | | 26.47 | 100 | 52 |
| Ex. 14 | A1 | 72.92 | B3 | 0.04 | C1 | 0.58 | | | | 26.47 | 100 | 60 |
| Ex. 15 | A2 | 72.92 | B3 | 0.04 | C1 | 0.58 | | | | 26.47 | 100 | 50 |
| Ex. 16 | A2 | 82.92 | B3 | 0.04 | C1 | 0.58 | | | | 16.42 | 100 | 35 |
| Ex. 17 | A2 | 74.70 | B3 | 0.10 | C2 | 0.20 | | | | 25.00 | 100 | 75 |
| Ex. 18 | A3 | 72.92 | B3 | 0.04 | C1 | 0.58 | | | | 26.47 | 100 | 65 |
| Ex. 19 | A2 | 72.98 | B1 | 0.005 | C1 | 0.58 | | | | 26.44 | 100 | 10 |
| Ex. 20 | A2 | 92.90 | B1 | 0.02 | C1 | 0.58 | | | | 6.50 | 100 | 5 |
| Ex. 21 | A2 | 72.75 | B1 | 0.02 | C1 | 0.58 | | | 0.15 | 26.50 | 100 | 90 |
| Ex. 22 | A2 | 74.90 | B1 | 0.02 | | | D1 | 0.005 | | 25.08 | 100 | 29 |
| Ex. 23 | A2 | 74.80 | B1 | 0.02 | | | D1 | 0.10 | | 25.08 | 100 | 30 |
| Ex. 24 | A2 | 72.40 | B1 | 0.02 | | | D1 | 2.50 | | 25.08 | 100 | 30 |
| Ex. 25 | A2 | 71.60 | B1 | 0.02 | | | D1 | 3.30 | | 25.08 | 100 | 29 |
| Ex. 26 | A2 | 74.80 | B1 | 0.02 | | | D2 | 0.10 | | 25.08 | 100 | 30 |
| Ex. 27 | A2 | 72.40 | B1 | 0.02 | | | D2 | 2.50 | | 25.08 | 100 | 31 |
| Ex. 28 | A2 | 74.80 | B1 | 0.02 | | | D3 | 0.10 | | 25.08 | 100 | 30 |
| Ex. 29 | A2 | 72.40 | B1 | 0.02 | | | D3 | 2.50 | | 25.08 | 100 | 30 |
| Ex. 30 | A2 | 72.40 | B1 | 0.02 | | | D4 | 2.50 | | 25.08 | 100 | 30 |
| Ex. 31 | A2 | 72.40 | B1 | 0.02 | | | D5 | 2.50 | | 25.08 | 100 | 30 |
| Comp. Ex. 1 | A4 | 73.61 | B1 | 0.02 | C1 | 0.58 | | | | 25.79 | 100 | 200 |
| Comp. Ex. 2 | A5 | 73.61 | B1 | 0.02 | C1 | 0.58 | | | | 25.79 | 100 | 115 |
| Comp. Ex. 3 | A2 | 72.25 | B1 | 0.15 | C1 | 0.58 | | | | 27.02 | 100 | 200 |
| Comp. Ex. 4 | A2 | 62.90 | B1 | 0.02 | C1 | 0.58 | | | | 36.50 | 100 | 350 |
| Comp. Ex. 5 | A2 | 73.76 | B1 | 0.04 | C2 | 1.20 | | | | 25.00 | 100 | 1000 |

Units of values listed in Table 1 correspond to wt % (where, a unit of electrical conductivity (μs/cm) is excluded). Referring to Table 1 above, solvents corresponding to A1 to A5 refer to propyleneglycol monoethyl ether, propyleneglycol n-propyl ether, diethyleneglycol monoethyl ether, acetonitrile, and sulforane, respectively. Propyleneglycol monoethyl ether has a dielectric constant of 10.4, propyleneglycol n-propyl ether has a dielectric constant of 11.0, diethyleneglycol monoethyl ether has a dielectric constant of 11.9, acetonitrile has a dielectric constant of 37.5, and sulforane has a dielectric constant of 44.0. In addition, the pH-adjusting agents corresponding to B1 to B3 refer to tetramethyl ammonium hydroxide, tetraethyl ammonium hydroxide, and 1,8-diazabicyclo[5.4.0]undec-7-ene (DBU), respectively. Ammonium salts corresponding to C1 and C2 refer to ammonium hydroxide and ammonium acetate respectively. The diamine compounds corresponding to D1 to D5 refer to 1,2-diaminoethane, 1,3-diaminopropane, 1,4-diaminobutane, 1,5-diaminopentane, and 1-propylamine, respectively. Last, the fluoride corresponding to E1 corresponds to tetrabutyl ammonium fluoride.

Experiment Example 1 Etching Rate Evaluation for Aluminum Oxide Film

A silicon wafer on which an aluminum oxide film having a thickness of 140 Å was deposited was cut to a size of 2 cm×2 cm to prepare a specimen. The specimen was immersed in a thermostat with the stripper composition according to Examples 1 to 31 and Comparative Examples 1 to 5 at about 25° C. for about 1 minute. Thereafter, the specimen was taken out, cleaned with water, and then dried using nitrogen ($N_2$). Each of etching rates for the substrate film was measured using an ellipsometer by comparing film thicknesses before and after immersion, and experiment results were listed in an 'Aluminum oxide film etching rate (Å/min)' column of Table 2. Etching evaluation criteria are as follows. '◎' means a case where the etching rate is 20 Å/min or more and less than 40 Å/min, '○' means a case where the etching rate is 10 Å/min or more and less than 20 Å/min, and 'Δ' means a case where the etching rate is 10 Å/min or less. In addition, 'X' means a case where the etching is not performed.

Experiment Example 2 Etching Rate Evaluation for Silicon Oxide Film

A silicon wafer on which a silicon oxide film having a thickness of 500 Å was deposited was cut to a size of 2 cm×2 cm to prepare a specimen. The specimen was immersed in a thermostat with the stripper composition according to Examples 1 to 31 and Comparative Examples 1 to 5 at about 25° C. for about 1 minute. Thereafter, the specimen was taken out, cleaned with water, and then dried using nitrogen ($N_2$). Each of etching rates for the substrate film was measured using an ellipsometer by comparing film thicknesses before and after immersion, and experiment results were listed in a 'Silicon oxide film etching rate (Å/min)' column of Table 2. The etching evaluation criteria are as follows. '○' means a case where the etching rate is less than 2 Å/min, and 'Δ' means a case where the etching rate is 2 Å/or more and less than 4 Å/min. In addition, 'X' means a case where the etching rate is 4 Å/min or more.

Experiment Example 3 Etching Rate Evaluation for Tungsten Oxide Film

A silicon wafer, on which a tungsten oxide film having a thickness of 40 Å was deposited, was cut to a size of 3 cm×3 cm to prepare a specimen. The specimen was immersed in a thermostat with the stripper composition according to Examples 1 to 31 and Comparative Examples 1 to 5 at about 25° C. for about 1 minute. Thereafter, the specimen was taken out, cleaned with water, and then dried using nitrogen ($N_2$). Each of the etching rates for the substrate film was measured using an X-ray fluorescence (XRF) by comparing film thicknesses before and after immersion, and the experiment results were listed in an 'Tungsten oxide film etching rate (Å/min)' column of Table 2. The etching evaluation criteria are as follows. '◎' means a case where the etching rate is 20 Å/min or more and less than 40 Å/min, '○' means a case where the etching rate is 10 Å/min or more and less than 20 Å/min, and 'Δ' means a case where the etching rate is 10 Å/min or less. In addition, 'X' means a case where the etching is not performed.

TABLE 2

| Classification | Aluminum oxide film etching rate (Å/min) | Silicon oxide film etching rate (Å/min) | Tungsten oxide film etching rate (Å/min) |
|---|---|---|---|
| Example 1 | ◎ | ○ | ◎ |
| Example 2 | ◎ | ○ | ◎ |
| Example 3 | ◎ | ○ | ◎ |
| Example 4 | ◎ | ○ | ◎ |
| Example 5 | ○ | ○ | ◎ |
| Example 6 | ○ | ○ | ◎ |
| Example 7 | ◎ | ○ | ◎ |
| Example 8 | ◎ | ○ | ◎ |
| Example 9 | ◎ | ○ | ◎ |
| Example 10 | ◎ | ○ | ◎ |
| Example 11 | ○ | ○ | ◎ |
| Example 12 | ◎ | ○ | ◎ |
| Example 13 | ◎ | ○ | ◎ |
| Example 14 | ◎ | ○ | ◎ |
| Example 15 | ◎ | ○ | ◎ |
| Example 16 | ○ | ○ | ◎ |
| Example 17 | ◎ | ○ | ◎ |
| Example 18 | ◎ | ○ | ◎ |
| Example 19 | Δ | ○ | Δ |
| Example 20 | Δ | ○ | ◎ |
| Example 21 | ○ | Δ | ◎ |
| Example 22 | ◎ | ○ | ○ |
| Example 23 | ◎ | ○ | ◎ |
| Example 24 | ◎ | ○ | ◎ |
| Example 25 | ◎ | ○ | Δ |
| Example 26 | ◎ | ○ | ◎ |
| Example 27 | ◎ | ○ | ◎ |
| Example 28 | ◎ | ○ | ◎ |
| Example 29 | ◎ | ○ | ◎ |
| Example 30 | ◎ | ○ | Δ |
| Example 31 | ◎ | ○ | Δ |
| Comparative Example 1 | Δ | ○ | ◎ |
| Comparative Example 2 | Δ | ○ | ◎ |
| Comparative Example 3 | ◎ | ○ | ◎ |
| Comparative Example 4 | ○ | ○ | ◎ |
| Comparative Example 5 | X | ○ | X |

Experiment Example 4 Etching Rate Evaluation for Tungsten Film

A silicon wafer, on which a tungsten film having a thickness of 1000 Å was deposited, was cut to a size of 3 cm×3 cm to prepare a specimen. The specimen was immersed in a thermostat with the stripper compositions according to Examples 1 to 31 and Comparative Examples 1 to 5 at about 25° C. for about 30 minutes. Thereafter, the specimen was taken out, cleaned with water, and then dried using nitrogen ($N_2$). Each of the etching rates for the substrate film was measured using the X-ray fluorescence (XRF) by comparing the film thicknesses before and after immersion. The evaluation was performed for 30 minutes, and then the values converted to the etching rates per minute were expressed as the final etching rates. Experiment results were listed in an 'Tungsten etching rate (Å/min)' column of Table 3 below. The etching evaluation criteria are as follows. '○' means a case where the etching rate is less than 2 Å/min, and 'Δ' means a case where the etching rate is 2 Å/or more and less than 4 Å/min. In addition, 'X' means a case where the etching rate is 4 Å/min or more.

Experiment Example 5 Etching Rate Evaluation of Tungsten Film Through Voltage Application A silicon wafer, on which a tungsten film having a thickness of 1000 Å was deposited, was cut to a size of 3 cm×3 cm to prepare a specimen. The specimen was immersed in a thermostat with the stripper compositions according to Examples 1 to 31 and Comparative Examples 1 to 5 at about 25° C. for about 10 minutes, while a voltage of 1 V was applied with the VersaSTAT3 equipment using the specimen as a working electrode and a platinum electrode as a reference electrode and a counter electrode. Thereafter, the specimen was taken out, cleaned with water, and then dried using nitrogen ($N_2$). Each of the etching rates for the substrate film was measured using X-ray fluorescence by comparing the film thicknesses before and after immersion. The evaluation was performed for about 10 minutes, and then, the values converted to etching rates per minute were expressed as the final etching rates. The experiment results were listed in a 'Tungsten film etching rate (Å/min) when a voltage applied' column of Table 3 below. The etching evaluation criteria are as follows. '◎' means a case where the etching rate is less than 5 Å/min, '○' means a case where the etching rate is 5 Å/min or more and less than 10 Å/min, and 'Δ' means a case where the etching rate is 10 Å/min or more and less than 15 Å/min. In addition, 'X' means a case where the etching rate is 15 Å/min or more.

TABLE 3

| Classification | Tungsten etching rate (Å/min) | Tungsten etching rate (Å/min) when voltage is applied |
|---|---|---|
| Example 1 | ○ | ◎ |
| Example 2 | ○ | ◎ |
| Example 3 | ○ | ◎ |
| Example 4 | ○ | Δ |
| Example 5 | ○ | ◎ |
| Example 6 | ○ | ◎ |
| Example 7 | ○ | ◎ |
| Example 8 | ○ | ◎ |
| Example 9 | ○ | ◎ |
| Example 10 | ○ | ◎ |
| Example 11 | ○ | ◎ |
| Example 12 | ○ | ◎ |
| Example 13 | ○ | ◎ |
| Example 14 | ○ | ◎ |
| Example 15 | ○ | ◎ |
| Example 16 | ○ | ◎ |
| Example 17 | ○ | ○ |
| Example 18 | ○ | ◎ |
| Example 19 | ○ | ◎ |
| Example 20 | Δ | ◎ |
| Example 21 | ○ | Δ |
| Example 22 | Δ | ◎ |
| Example 23 | ○ | ◎ |
| Example 24 | ○ | ◎ |
| Example 25 | ○ | ◎ |
| Example 26 | ○ | ◎ |
| Example 27 | ○ | ◎ |
| Example 28 | ○ | ◎ |
| Example 29 | ○ | ◎ |

TABLE 3-continued

| Classification | Tungsten etching rate (Å/min) | Tungsten etching rate (Å/min) when voltage is applied |
|---|---|---|
| Example 30 | ○ | ◎ |
| Example 31 | ○ | ◎ |
| Comparative Example 1 | ○ | X |
| Comparative Example 2 | ○ | X |
| Comparative Example 3 | X | X |
| Comparative Example 4 | ○ | X |
| Comparative Example 5 | ○ | ◎ |

Referring to Tables 2 and 3, the stripper compositions for etching a metal oxide film, according to Examples 1 to 31, each use an organic solvent having a dielectric constant of 30 or less and include a pH-adjusting agent and an ammonium salt in an appropriate amount range, leading to the result that the etching rate of the metal oxide film in a certain level was secured without damage to the silicon oxide film and the tungsten film, which are the protective films.

However, in the cases of Examples 5, 11, and 16, the content of water was slightly reduced, leading to the result that the etching rate of the aluminum oxide film was also slightly lowered. In addition, it was confirmed that the etching rate of the tungsten oxide film was maintained as it was and there was no damage to the protective film.

In the case of Example 19, the content of the pH-adjusting agent was less than the appropriate range disclosed in inventive concepts, resulting in a slight decrease in the etching rates of both the aluminum oxide film and the tungsten oxide film.

In the case of Example 20, the content of water was less than the appropriate range disclosed in inventive concepts, resulting in a slight decrease in the etching rate of the aluminum oxide film.

In the case of Example 21, since fluoride was included, it can be confirmed that the silicon oxide film, which was the protective film, was slightly damaged, and when the voltage was applied to the tungsten film, the tungsten, which was the protective film, was damaged as well due to an increase in the electrical conductivity.

In the case of Example 22, since the content of the diamine compound was less than the appropriate range disclosed in inventive concepts, the etching performance decreased, and thus, the etching rate of the tungsten film, which was a protective film, was slightly increased.

In the case of Example 25, since the content of the diamine compound exceeded the appropriate range disclosed in inventive concepts, the film layer that needs to be removed was limited and/or prevented from etching, leading to the result that the etching rate of the tungsten oxide film was also reduced.

In the cases of Examples 30 and 31, since the diamine compound having 5 or more carbon atoms was used, or a compound having an amine group only on one side was used, a complex compound with the metal oxide film was not stably formed, leading to the result that the etching rate of the tungsten oxide film was slightly slowed down.

Comparative Examples 1 and 2 used acetonitrile having the dielectric constant of 37.5 and sulfolane having the dielectric constant of 44.0, respectively, as an organic solvent, thereby using an aprotic solvent having a relatively high dielectric constant compared to the organic solvents used in the stripper composition according to Examples 1 to 31. As a result, the aluminum oxide film has a relatively low etching rate, and when the voltage was applied, the etching rate of tungsten was accelerated due to the high electrical conductivity of the stripper composition, resulting in the damage to the tungsten film, which is the protective film.

In the case of Comparative Example 3, the content of the pH-adjusting agent exceeded the appropriate range disclosed in inventive concepts, and accordingly, the etching rate of the metal oxide film was accelerated, but the etching rate of the tungsten film, which was the protective film, was also accelerated to be damaged.

In the case of Comparative Example 4, since the content of water exceeded the appropriate range disclosed in inventive concepts, the electrical conductivity of the stripper composition increased. As a result, when the voltage was applied, the etching rate of the tungsten oxide film was accelerated, resulting in damage to the tungsten film, which was the protective film.

In the case of Comparative Example 5, since the content of the ammonium salt exceeded the appropriate range disclosed in inventive concepts, leading to the result that the pH of the stripper composition was lowered, and thus, the metal oxide film was not etched.

According to the stripper composition described in this specification, even if charges momentarily accumulate during the dry etching process, current may be limited and/or prevented from flowing by lowering the conductivity of the composition and damage to the lower metal film during cleaning may be also minimized.

Inventive concepts, when performing the strip process using the above-described stripper composition, may also provide a method of removing a metal oxide film characterized by selectively removing the metal oxide film while minimizing damage to the lower metal at the same time.

As described above, embodiments have been described in the specifications with reference to the drawings. Although the embodiments have been described using specific terms in this specification, they are only used for the purpose of explaining technical ideas of inventive concepts and are not used to limit the scope of inventive concepts described in the claims. Therefore, it should be understood that various changes, modifications, and other equivalent embodiments can be made by one ordinary skilled in the art. Therefore, the true technical protection scope of inventive concepts should be determined by the technical spirit of the following claims.

While inventive concepts have been particularly shown and described with reference to embodiments thereof, it will be understood that various changes in form and details may be made therein without departing from the spirit and scope of the following claims.

What is claimed is:

1. A stripper composition consisting of:

a polar organic solvent;

a pH-adjusting agent;

an ammonium salt, and deionized water (DIW), wherein the pH-adjusting agent is included in an amount of 0.01 wt % to 0.1 wt % with respect to a total weight of the stripper composition, wherein the polar organic solvent is selected from the group consisting of a linear alcohol, a diol alcohol, a branched alcohol, glycol ether, and mixtures thereof, and the polar organic solvent is included in an amount of 60 wt % to 99 wt % with respect to a total weight of the stripper composition, and wherein the pH-adjusting agent is selected from the group consisting of tetramethyl ammonium hydroxide, tetraethyl ammonium hydroxide, tetrapropyl ammonium hydroxide, acetamidine, imidazole, 2-methylimidazole, 1,4,5,6-tetrahydropyrimidine, 2-methyl-1,4,5,6-tetrahydropyrimidine, 2-phenyl-1,4,5,6-tetrahydropyrimidine, aminopiperidine, 1,8-diazabicyclo[5.4.0]undec-7-ene (DBU), 1,5-diazabicyclo[4.3.0]-5-nonene (DBN), 1,4-diazabicyclo[2.2.0]octane (DABCO), 1,5,7-triazabicyclo[4.4.0]dec-5-ene (TBD), 7-methyl-1,5,7-triazabicyclo[4.4.0]dec-5-ene (MTBD), and mixtures thereof.

2. The stripper composition of claim 1, wherein the linear alcohol is at least one of ethanol, propanol, butanol, pentanol, hexanol, heptanol, octanol, nonanol, and decanol.

3. The stripper composition of claim 1, wherein the branched alcohol is at least one of DL-2-methyl-1-butanol and 4-methyl-2-pentanol.

4. The stripper composition of claim 1, wherein the glycol ether is at least one of diethyleneglycol monomethyl ether, diethyleneglycol monoethyl ether, triethyleneglycol monomethyl ether, triethyleneglycol monobutyl ether, propyleneglycol monomethyl ether, propyleneglycol monoethyl ether, and propyleneglycol propyl ether.

5. The stripper composition of claim 1, wherein the polar organic solvent has a dielectric constant of 30 or less.

6. The stripper composition of claim 1, wherein the ammonium salt is selected from the group consisting of ammonium hydroxide, ammonium citrate, ammonium acetate, ammonium malonate, ammonium adipate, ammonium lactate, ammonium iminodiacetate, ammonium chloride, ammonium bromide, ammonium sulfate, ammonium oxalate, ammonium tartrate, triammonium citrate, ammonium carbamate, ammonium carbonate, ammonium benzoate, tetraammonium ethylenediaminetetraacetate, diammonium ethylenediaminetetraacetate, ammonium succinate, ammonium formate, and mixtures thereof, and the ammonium salt is included in an amount of 0.01 wt % to 1.0 wt % with respect to a total weight of the stripper composition.

7. The stripper composition of claim 1, wherein the stripper composition has an electrical conductivity of 0.1 μS/cm to 99.9 μS/cm.

8. The stripper composition of claim 1, wherein the pH-adjusting agent is one of an alkylammonium hydroxide or an amidine compound, and the pH-adjusting agent is configured to dissolve a metal oxide film into a metal hydroxide form.

* * * * *